United States Patent
Lee et al.

(10) Patent No.: US 11,854,963 B2
(45) Date of Patent: Dec. 26, 2023

(54) SEMICONDUCTOR INTERCONNECTION STRUCTURE AND METHODS OF FORMING THE SAME

(71) Applicant: TAIWAN SEMICONDUCTOR MANUFACTURING COMPANY, LTD., Hsinchu (TW)

(72) Inventors: Shao-Kuan Lee, Kaohsiung (TW); Kuang-Wei Yang, Hsinchu (TW); Cherng-Shiaw Tsai, New Taipei (TW); Cheng-Chin Lee, Taipei (TW); Ting-Ya Lo, Hsinchu (TW); Chi-Lin Teng, Taichung (TW); Hsin-Yen Huang, New Taipei (TW); Hsiao-Kang Chang, Hsinchu (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 300 days.

(21) Appl. No.: 17/346,209

(22) Filed: Jun. 12, 2021

(65) Prior Publication Data

US 2022/0285268 A1    Sep. 8, 2022

Related U.S. Application Data

(60) Provisional application No. 63/156,162, filed on Mar. 3, 2021.

(51) Int. Cl.
*H01L 23/522* (2006.01)
*H01L 23/532* (2006.01)
(Continued)

(52) U.S. Cl.
CPC .... *H01L 23/5226* (2013.01); *H01L 21/76802* (2013.01); *H01L 21/76877* (2013.01); *H01L 23/528* (2013.01); *H01L 23/532* (2013.01)

(58) Field of Classification Search
CPC ........... H01L 23/5226; H01L 21/76802; H01L 21/76877; H01L 23/528; H01L 23/532; H01L 21/7682; H01L 21/76826; H01L 21/76834; H01L 21/76849; H01L 21/76885; H01L 21/76811; H01L 21/76829; H01L 21/76838

See application file for complete search history.

(56) References Cited

U.S. PATENT DOCUMENTS 9,105,490 B2    8/2015  Wang et al.
9,236,267 B2    1/2016  De et al.
(Continued)

*Primary Examiner* — Karen Kusumakar
(74) *Attorney, Agent, or Firm* — NZ CARR LAW OFFICE

(57) ABSTRACT

An interconnect structure includes a dielectric layer, a first conductive feature, a hard mask layer, a conductive layer, and a capping layer. The first conductive feature is disposed in the dielectric layer. The hard mask layer is disposed on the first conductive feature. The conductive layer includes a first portion and a second portion, the first portion of the conductive layer is disposed over at least a first portion of the hard mask layer, and the second portion of the conductive layer is disposed over the dielectric layer. The hard mask layer and the conductive layer are formed by different materials. The capping layer is disposed on the dielectric layer and the conductive layer.

20 Claims, 12 Drawing Sheets

(51) Int. Cl.
*H01L 21/768* (2006.01)
*H01L 23/528* (2006.01)

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2016/0111325 A1* | 4/2016 | JangJian | H01L 21/76802 257/774 |
| 2017/0110397 A1* | 4/2017 | Wu | H01L 21/02282 |
| 2021/0305090 A1* | 9/2021 | Cheng | H01L 21/76813 |

\* cited by examiner

US 11,854,963 B2

SEMICONDUCTOR INTERCONNECTION STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, for any two adjacent conductive features, as the distance between the conductive features decreases, the resulting capacitance (a function of the dielectric constant (k value) of the insulating material divided by the distance between the conductive features) increases. This increased capacitance results in increased capacitive coupling between the conductive features, increased power consumption, and an increase in the resistive-capacitive (RC) time constant.

Therefore, there is a need in the art to provide an improved device that can address the issues mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
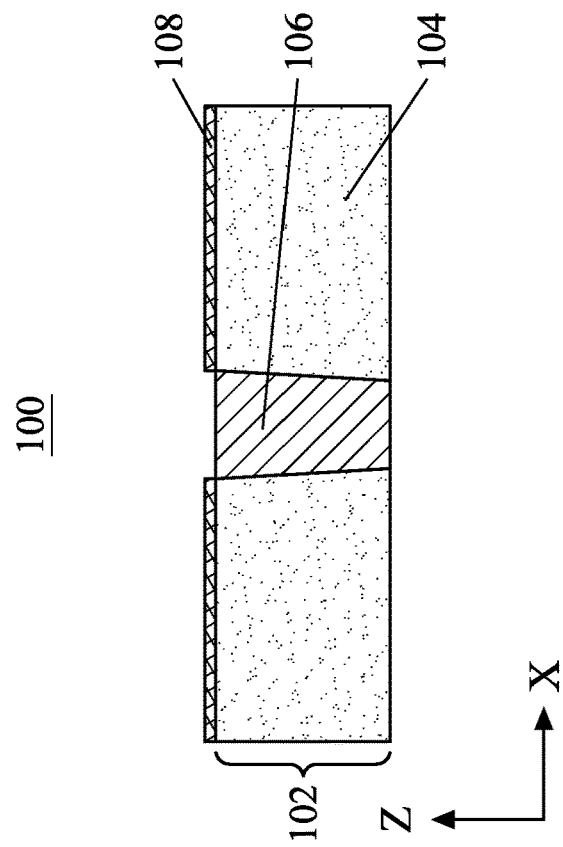
FIGS. 1A-1H are cross-sectional side views of various stages of manufacturing an interconnect structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1H are cross-sectional side views of various stages of manufacturing an interconnect structure 100, in accordance with some embodiments. The interconnect structure 100 may be formed on various devices of a semiconductor structure. For example, the interconnect structure 100 may be formed over one or more devices, such as transistors, diodes, imaging sensors, resistors, capacitors, inductors, memory cells, combinations thereof, and/or other suitable devices. In some embodiments, the interconnect structure 100 may be formed over the transistors, such as nanostructure FET having a plurality of channels wrapped around by a gate electrode layer.

As shown in FIG. 1A, the interconnection structure 100 includes a layer 102, which may be an ILD layer or an intermetal dielectric (IMD) layer. The layer 102 includes a dielectric layer 104, one or more conductive features 106 (only one is shown) disposed in the dielectric layer 104, and an optional cap layer (not shown) disposed on each conductive feature 106. In some embodiments, the dielectric layer 104 includes silicon oxide. The dielectric layer 104 may be formed by chemical vapor deposition (CVD), atomic layer deposition (ALD), spin coating, or other suitable process. The conductive feature 106 may each include an electrically conductive material, such as Cu, Co, Ru, Mo, Cr, W, Mn, Rh, Ir, Ni, Pd, Pt, Ag, Au, Al, alloys thereof, or other suitable material. In some embodiments, the conductive feature 106 and the cap layer each includes a metal. The conductive feature 106 may be formed by physical vapor deposition (PVD), CVD, ALD, or other suitable process. The conductive features 106 may be electrically connected to conductive contacts beneath the interconnection structure 100.

Figure 1B:
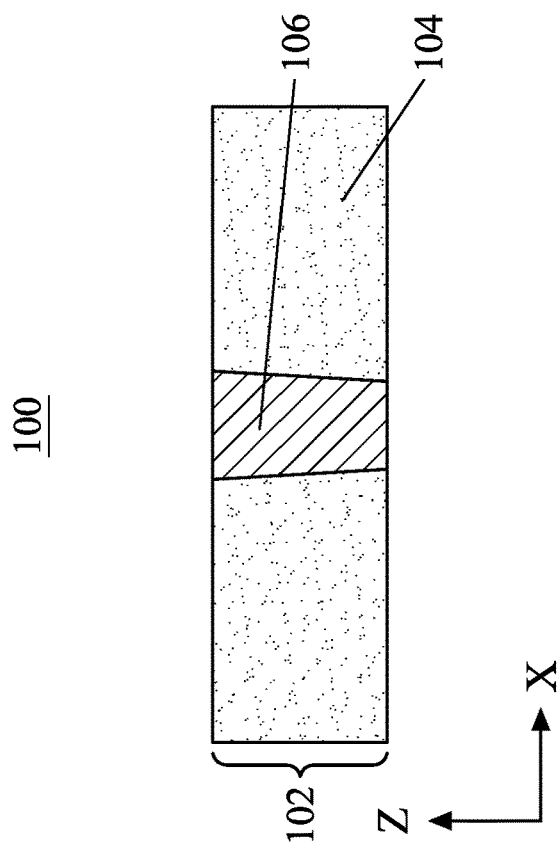

As shown in FIG. 1B, a blocking layer 108 is formed on the dielectric layer 104. In some embodiments, the blocking layer 108 is formed on the top of the layer 102 except the portion having the conductive features 106. In some embodiments, before forming the blocking layer 108, a pre-treatment process may be performed on the top surface of the dielectric layer 104 and the conductive feature 106 to clean the reaction surface for a better selectivity of the formation of the blocking layer 108. In some embodiments, the pre-treatment process may include solvent clean, acid clean or plasma clean.

The blocking layer 108 may include a polymer including silicon, carbon, nitrogen, oxygen or a combination thereof. In some embodiments, the blocking layer 108 is formed on the dielectric layer 104 by an oxide inhibition process. In some embodiments, in the oxide inhibition process, a silane based self-assembled monolayer (SAM) may be used as an inhibitor. In some embodiments, the silane based SAM may include Octadecyltrichlorosilane (ODTS), Octadecyltrimethoxysilane (OTMS), (3-Aminopropyl)triethoxysilane (APTES), Butyltriethoxysilane, Cyclohexyltrimethoxysilane, Cyclopentyltrimethoxysilane, Dodecyltriethoxysilane, Dodecyltrimethoxysilane, Decyltriethoxysilane, Dimethoxy(methyl)-n-octylsilane, Triethoxyethylsilane, Ethyltrimethoxysilane, Hexyltrimethoxysilane, Hexyltriethoxysilane, Hexadecyltrimethoxysilane, Hexadecyltriethoxysilane, Triethoxymethylsilane, Trimethoxy(methyl)silane, Methoxy(dimethyl)octadecylsilane, Methoxy(dimethyl)-n-octylsilane, Octadecyltriethoxysilane, Triethoxy-n-octylsilane, Trimethoxy(propyl)silane, Trimethoxy-n-octylsilane, Triethoxy(propyl)silane, or other suitable compound. In some embodiments, the blocking layer 108 may be formed by CVD, molecular layer deposition (MLD), or other suitable process. In some embodiments, the blocking layer 108 selectively forms on the dielectric surface of the dielectric layer 104 but not on the metallic surface of the conductive feature 106.

Figure 1C:
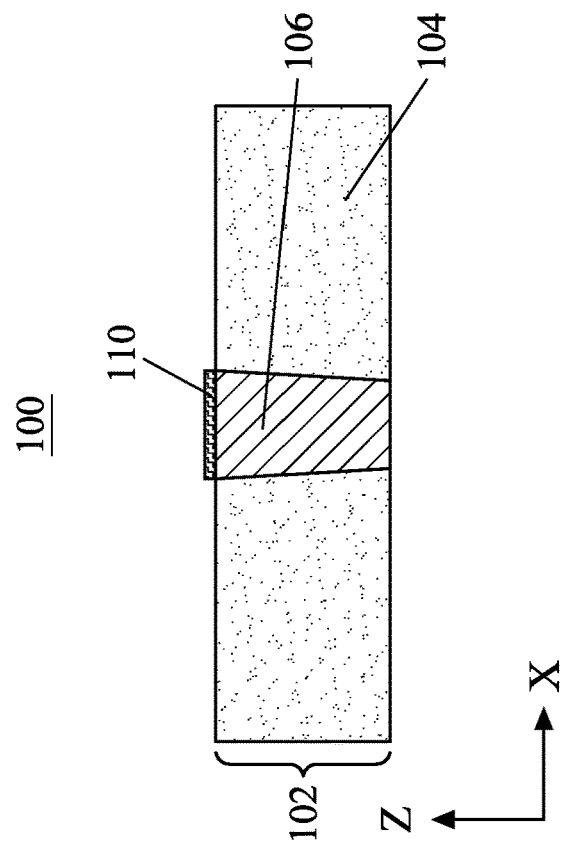

As shown in FIG. 1C, after forming the blocking layer 108, a hard mask layer 110 is formed on the conductive features 106. In some embodiments, the hard mask layer 110 may be a tantalum nitride (TaN) layer, a tantalum (Ta) layer or other suitable material that is different from a later formed glue layer and conductive layer. The hard mask layer 110 may include an electrically conductive material. In some embodiments, the hard mask layer 110 is formed on the conductive features 106 by CVD, ALD, spin coating, or other suitable process.

Because the hydrophilic/hydrophobic characteristics of the blocking layer 108, the hard mask layer 110 is prevented from being formed on the blocking layer 108, and therefore the hard mask layer 110 is formed on the area not covered by the blocking layer 108. In other words, the hard mask layer 110 is limited by the blocking layer 108 to be formed only on the conductive features 106. In some embodiments, the hard mask layer 110 may have a thickness from about 10 Angstroms to about 50 Angstroms.

Figure 1D:
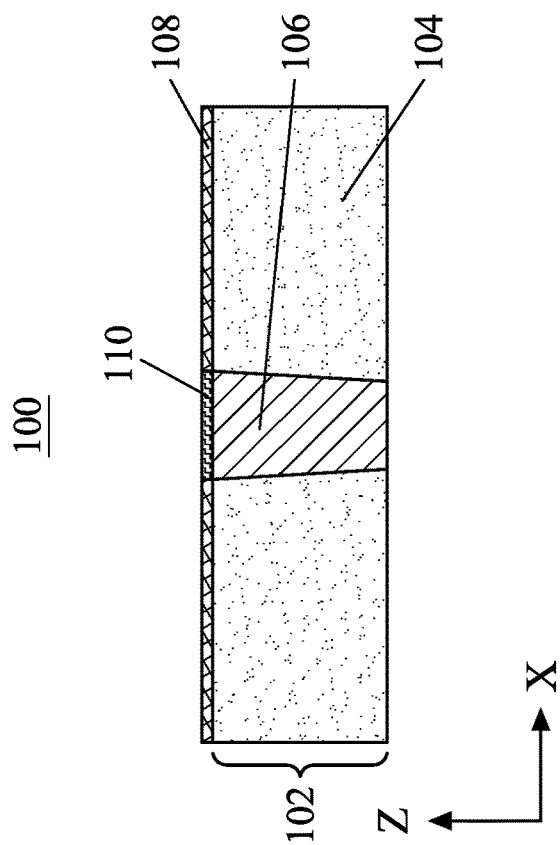

As shown in FIG. 1D, after the formation of the hard mask layer 110, the blocking layer 108 is removed. In some embodiments, the blocking layer 108 may be removed by a dry etch process, a wet etch process or other suitable processes. After the removal of the blocking layer 108, the hard mask layer 110 is remained on the conductive features 106.

Figure 1F:
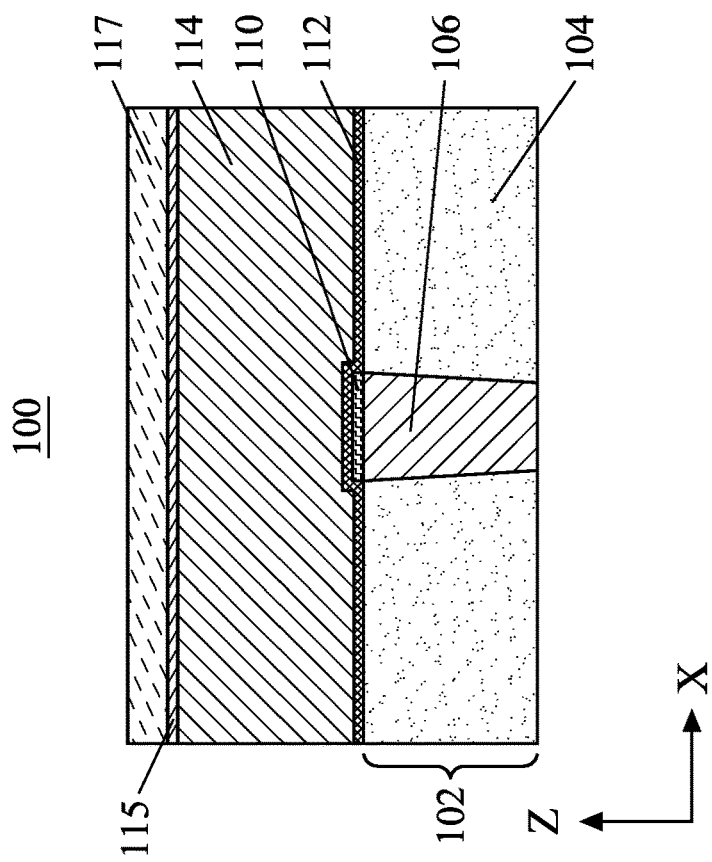
Figure 1E:
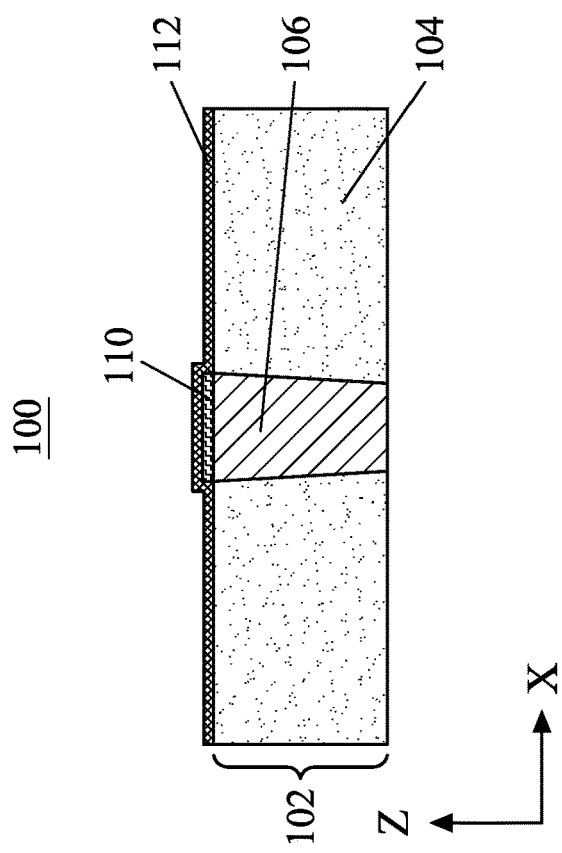

As shown in FIG. 1E, a glue layer 112 is formed over the hard mask 114 and the dielectric layer 104. The glue layer 112 may include a nitride, such as a metal nitride, and may be formed by PVD, CVD, ALD, or other suitable process. In some embodiments, the glue layer 112 includes TiN, WN or other suitable metal nitride. The glue layer 112 may include materials different from the hard mask 114. In some embodiments, the glue layer 112 and the hard mask 114 have different selectivity to the etchants used in an etch process. The glue layer 112 may have a thickness ranging from about 2 Angstroms to about 100 Angstroms. The glue layer 112 may provide adhesion between a later formed conductive layer and the dielectric layer 104.

As shown in FIG. 1F, a conductive layer 114, a mask layer 115 and a photoresist layer 117 may be formed on the glue layer 112. The conductive layer 114 may include the same material as the conductive feature 106 and may be formed by the same process as the conductive feature 106. The conductive layer 114 may include materials different from the hard mask 110. In some embodiments, the conductive layer 114 and the hard mask 110 have different selectivity to the etchants used in an etch process. The conductive layer 114 may have the same thickness as the conductive feature 106. The mask layer 115 may include TiN, WN or other suitable metal nitride, and may be formed by PVD, CVD, ALD, or other suitable process.

Figure 1H:
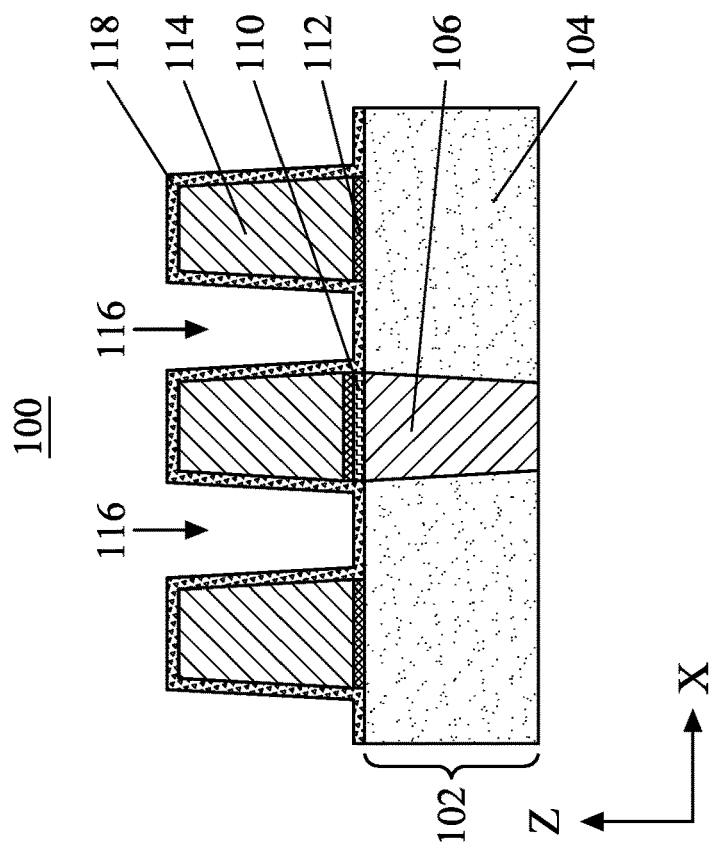
Figure 1G:
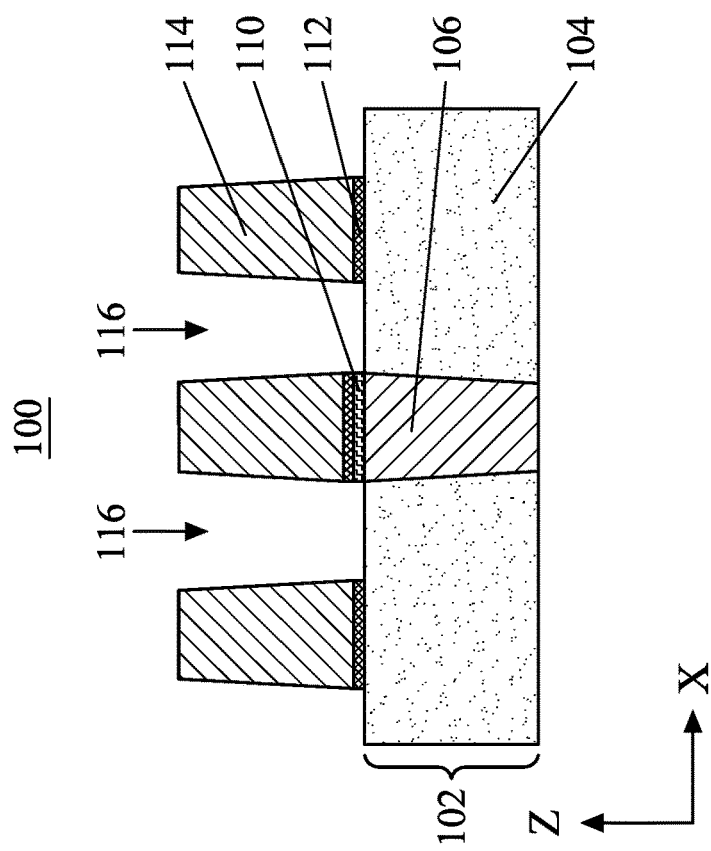

As shown in FIG. 1G, after the glue layer 112, the conductive layer 114, the mask layer 115 and the photoresist layer 117 are formed, openings 116 are formed in the glue layer 112, the conductive layer 114, the mask layer 115 and the photoresist layer 117, and then the mask layer 115 and the photoresist layer 117 are removed. Openings 116 may be formed by first patterning the mask layer 115 through the lithography process using the photoresist layer 117, followed by transferring the pattern of the mask layer 115 to the conductive layer 114 and the glue layer 112. The openings 116 may be formed by any suitable process, such as wet etch, dry etch, or a combination thereof. In some embodiments, the openings 116 are formed by one or more etch processes, such as a reactive ion etching (ME) process. The openings 116 separate the conductive layer 114 into one or more portions, such as a plurality of portions. Each portion may be a conductive feature, such as a conductive line. By forming the conductive features using ME of a conductive layer, limitations on metal gap filling and damaging of the ILD or IMD layer may be avoided.

As shown in FIG. 1H, a capping layer 118 is then formed on the exposed surfaces of the portions of the conductive layer 114, the glue layer 112, the hard mask layer 110 and the dielectric layer 104. The capping layer 118 may prevent metal diffusion from the conductive layer 114 to the subsequently formed dielectric material. The capping layer 118 may be made of a dielectric material. In some embodiments, the capping layer 118 includes SiCO, SiCN, SiN, SiCON, SiO$_x$, SiC, SiON, or other suitable dielectric materials. The capping layer 118 may be formed by any suitable process, such as PVD, ALD, CVD, PECVD, PEALD or any suitable conformal process. The term "conformal" may be used herein for ease of description upon a layer having substantial same thickness over various regions. The capping layer 118 may have a thickness ranging from about 5 Angstroms to about 200 Angstroms.

FIGS. 1G and 1H show a situation that the formation of the openings 116 is precisely aligned to the boundary of the conductive feature 106. Under this situation, the hard mask layer 110 is fully covered by the glue layer 112 and the conductive layer 114 after the formation of the openings 116, and then the capping layer 118 covers the exposed sidewalls of the hard mask layer 110. During the process of forming the openings 116, the conductive feature 106 may not be damaged by the wet etch or dry etch operations, because the openings 116 is precisely aligned to the boundary of the conductive feature 106.

Figure 2A:
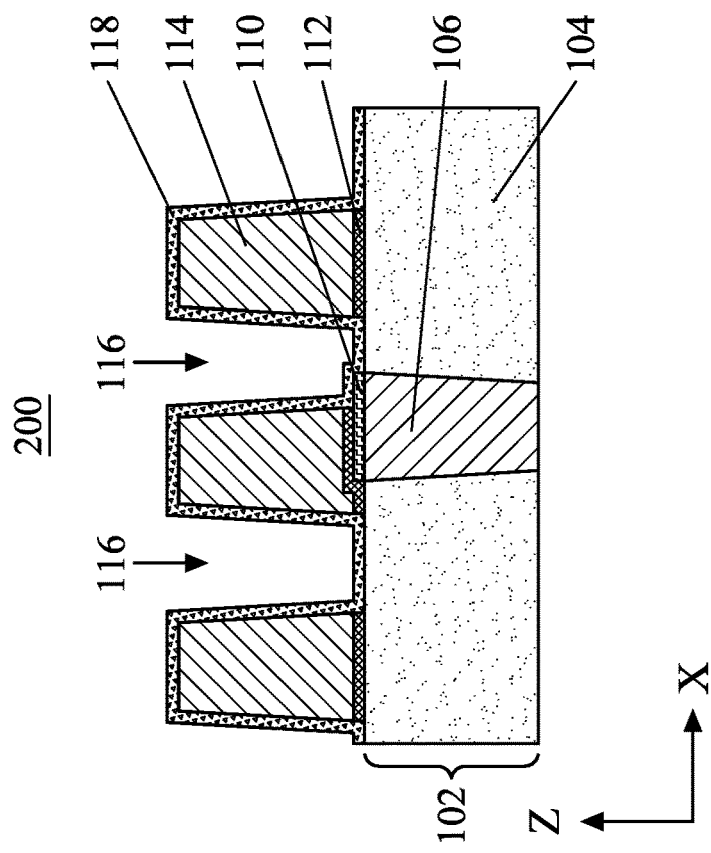
FIGS. 2A-2B are cross-sectional side views of various stages of manufacturing another interconnect structure, in accordance with some embodiments.
Figure 2B:
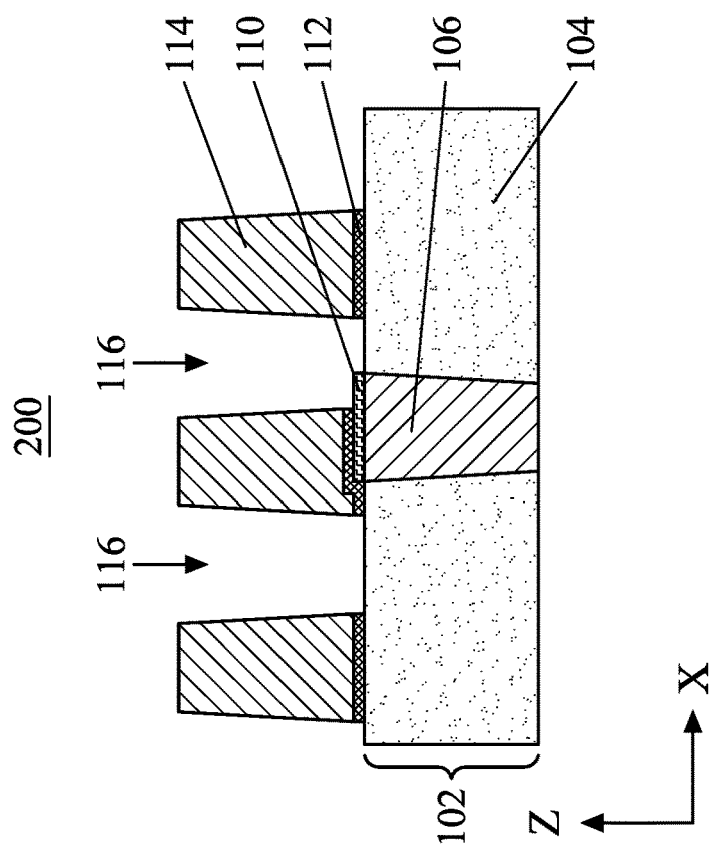

However, in some embodiments, the formation of the openings 116 may have a misalignment and the openings 116 may not be precisely aligned to the boundary of the conductive feature 106. FIGS. 2A-2B are cross-sectional side views of various stages of manufacturing another interconnect structure 200, in accordance with some embodiments. As shown in FIG. 2A, the formation of the openings 116 has a misalignment. After the removal of the portions of the glue layer 112 and the conductive layer 114, a portion of the top surface of the hard mask layer 110 is exposed.

Because the hard mask layer 110 is formed by materials different from the glue layer 112 and the conductive layer 114, the hard mask layer 110, comparing to the glue layer 112 and the conductive layer 114, has different selectivity to the etchants used in the etch process to remove the portions of the glue layer 112 and the conductive layer 114. After the removal process of the portions of the glue layer 112 and the conductive layer 114, the hard mask layer 110 may not be affected by the removal process and may be remained on the conductive feature 106. Under this situation, the conductive feature 106 is covered by the hard mask layer 110, and the removal process of the portions of the glue layer 112 and the conductive layer 114 does not damage the conductive feature 106.

Then, as shown in FIG. 2B, the capping layer 118 is formed on the exposed surfaces of the portions of the conductive layer 114, the glue layer 112, the hard mask layer 110 and the dielectric layer 104.

Figure 3A:
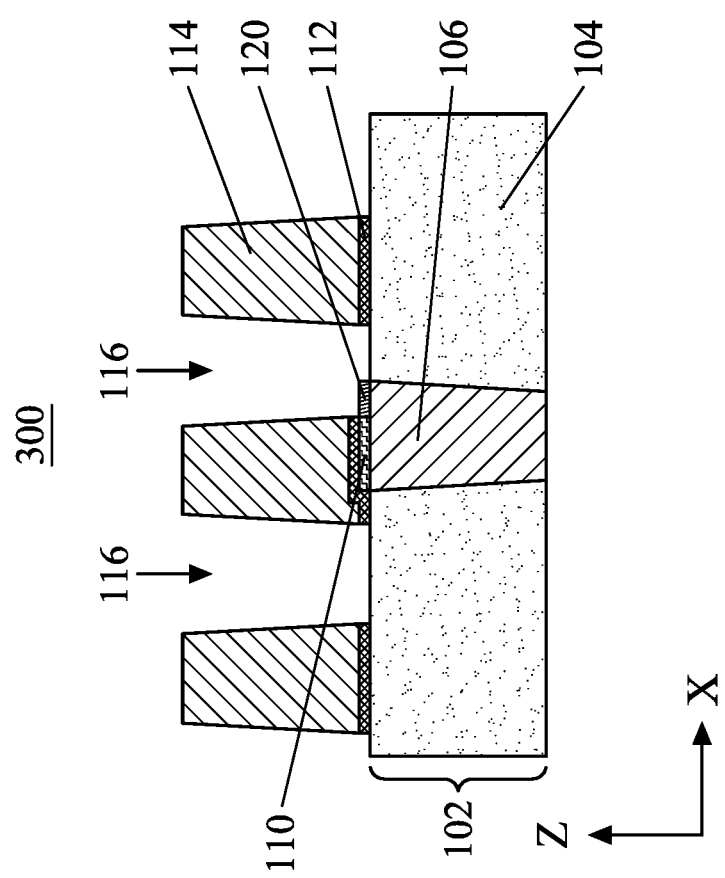
FIGS. 3A-3C are cross-sectional side views of various stages of manufacturing a further interconnect structure, in accordance with some embodiments.
Figure 3C:
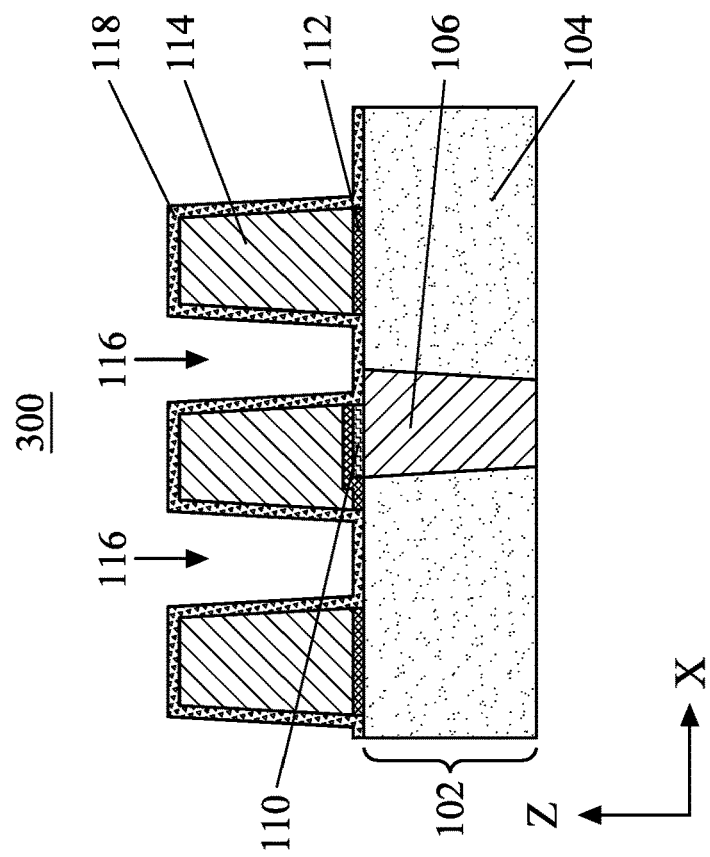
Figure 3B:
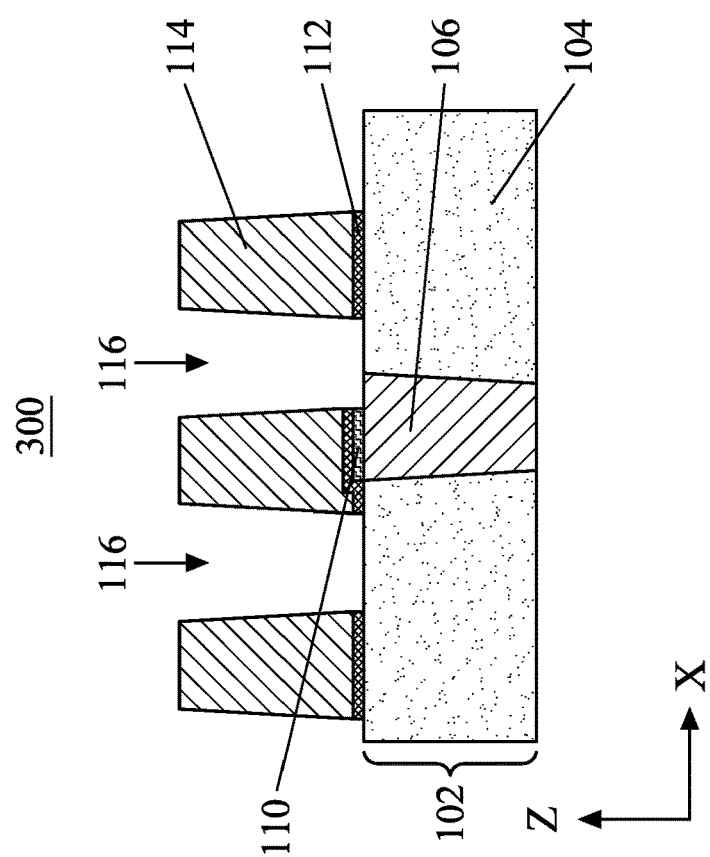

FIGS. 3A-3C are cross-sectional side views of various stages of manufacturing a further interconnect structure 300, in accordance with some embodiments. As shown in FIG. 3A, the formation of the openings 116 has a misalignment. After the removal of the portions of the glue layer 112 and the conductive layer 114, an exposed portion 120 of the hard mask layer 110 is exposed. In some embodiments, even though the hard mask layer 110 is remained on the conductive feature 106, the material or the molecular structure of the exposed portion 120 of the hard mask layer 110 may be changed or affected by the etchants used in the etch process to remove the portions of the glue layer 112 and the conductive layer 114. Then the exposed portion 120 of the hard mask layer 110, which is changed to a composition that is easier to remove, may be removed by etch process, plasma treatment or other suitable process, as shown in FIG. 3B. For example, in some embodiments, the etchant used to remove the portions of the glue layer 112 and the conductive layer 114 may include oxygen, and the exposed portion 120 of the hard mask layer 110 is changed from a metal nitride to a metal oxide. The metal oxide of the exposed portion 120 of the hard mask layer 110 may be removed by an anisotropic etch process that does not substantially affect the conductive layer 114, the glue layer 112, the conductive feature 106 and the dielectric layer 104. As a result, a portion of the conductive feature 106 is exposed.

In some embodiments, the material or the molecular structure of the exposed portion 120 of the hard mask layer 110 may not be changed or affected by the etchants used in the etch process to remove the portions of the glue layer 112 and the conductive layer 114. Another removal process may be provided to remove the exposed portion 120 of the hard mask layer 110 to expose the portion of the conductive feature 106. In some embodiments, the exposed portion 120 of the hard mask layer 110 may be removed by wet etch, dry etch or other suitable process.

In some embodiments, the hard mask layer 110 is formed by materials different from the conductive feature 106, and the hard mask layer 110 and the conductive feature 106 have different selectivity to the etchants used in the removal process of the exposed hard mask layer 110. Hence, in the removal process of the exposed portion 120 of the hard mask layer 110, the conductive feature 106 may not be damaged.

As shown in FIG. 3B, after removing the exposed portion 120 of the hard mask layer 110, the portion of the conductive feature 106 may be exposed. In some embodiments, the exposed portion 120 of the hard mask layer 110 may be fully removed, as shown in FIG. 3B. In some embodiments, the exposed portion 120 of the hard mask layer 110 may be partially removed. In some embodiments, the exposed portion 120 of the hard mask layer 110 that the material or the molecular structure is changed or affected by the removal process of the portions of the glue layer 112 and the conductive layer 114 may be remained on the conductive feature 106. For example, as shown in FIG. 3A, the hard mask layer 110 includes a first portion disposed between the glue layer 112 and the conductive feature 106 and a second portion 120 disposed between the capping layer 118 (FIG. 3C) and the conductive feature 106. The first portion of the hard mask layer 110 includes a different material than the second portion 120 of the hard mask layer 110.

Then, as shown in FIG. 3C, the capping layer 118 is formed on the exposed surfaces of the portions of the conductive layer 114, the glue layer 112, the hard mask layer 110, the dielectric layer 104, and the conductive feature 106.

In most embodiments, the openings 116 are aligned with the edge of the conductive feature 106, such as the boundaries between the conductive feature 106 and the dielectric layer 104 is aligned with the sides of the portion of the conductive layer 114 disposed over the conductive feature 106, as shown in FIG. 1G. In some embodiments, however, the opening 116 may be slightly misaligned with the edge of the conductive feature 106, as shown in FIGS. 2A and 3A.

The misalignment of the via is known as overly shift, which may be caused by an edge placement error (EPE). If the hard mask layer 110 is not present, the formation process of the openings 116 may damage the conductive feature 106, because the conductive feature 106, the glue layer 112 and the conductive layer 114 may be formed by the same or similar material. With the hard mask layer 110 disposed on the conductive feature 106, the conductive feature 106 is protected during the formation process of the openings 116.

During the removal of the portions of the glue layer 112 and the conductive layer 114, since the hard mask layer 110 covers the conductive feature 106 and the hard mask layer 110 has different selectivity to the etchants used in the etch process to remove the portions of the glue layer 112 and the conductive layer 114, the conductive feature 106 is not damaged. During the removal of the exposed hard mask layer 110, since the hard mask layer 110 and the conductive feature 106 have different selectivity to the etchants used in the removal process of the exposed hard mask layer 110, the conductive feature 106 is not damaged as well. Therefore, the conductive feature 106 is protected by the hard mask layer 110 during the formation process of the openings 116.

FIGS. 4A-4D are cross-sectional side views of various stages of manufacturing a further interconnect structure 400, in accordance with some embodiments. After forming the interconnect structure 100, 200 or 300, more operations may be performed to electrically connect the conductive layer 114 to other metal layers. The interconnect structure 200 in FIG. 2B is used as an example in FIGS. 4A-4D to describe the subsequent operations after FIG. 2B. It is understood that other interconnect structures, e.g., the interconnect structure 100 shown in FIG. 1H or the interconnect structure 300 shown in FIG. 3A or 3C, may be also applied to the operations disclosed in FIGS. 4A-4D.

Figure 4A:
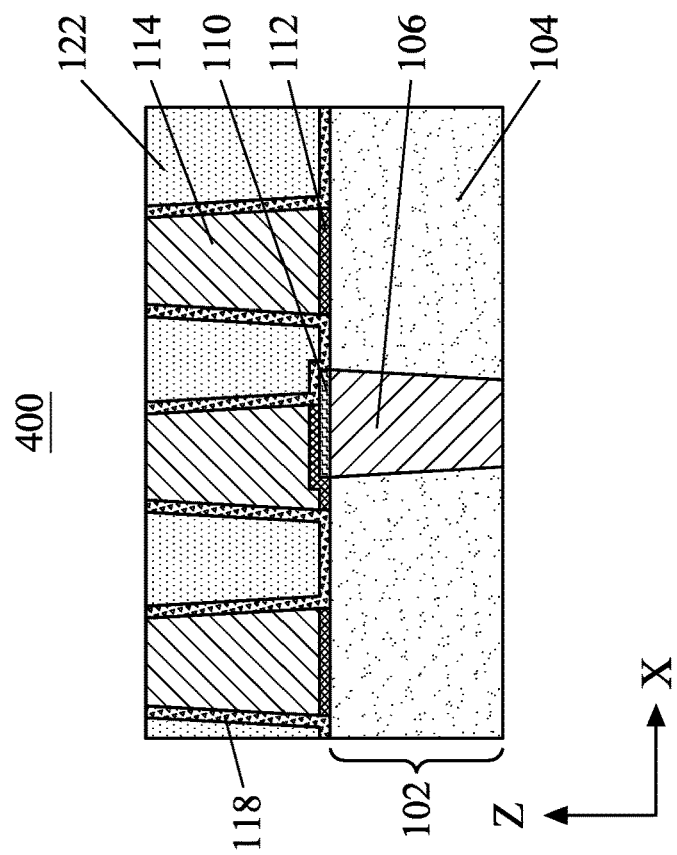
FIGS. 4A-4D are cross-sectional side views of various stages of manufacturing a further interconnect structure, in accordance with some embodiments.

As shown in FIG. 4A, after forming the capping layer 118, a dielectric fill 122 is formed on the capping layer 118. The dielectric fill 122 may be a silicon-containing material, such as SiCO, SiCN, SiN, SiCON, $SiO_x$, SiC, SiCOH, or SiON. In some embodiments, the dielectric fill 122 includes a low-k dielectric material having a k value ranging from about 2 to about 3.6, such as SiCOH. The low-k dielectric material may have a porosity ranging from about 0.1 percent to about 40 percent. The dielectric fill 122 may fill the openings 116 (FIG. 2B) and over the capping layer 118, as shown in FIG. 4A. The dielectric fill 122 may be formed by CVD, ALD, PECVD, PEALD, or other suitable process.

Figure 4B:
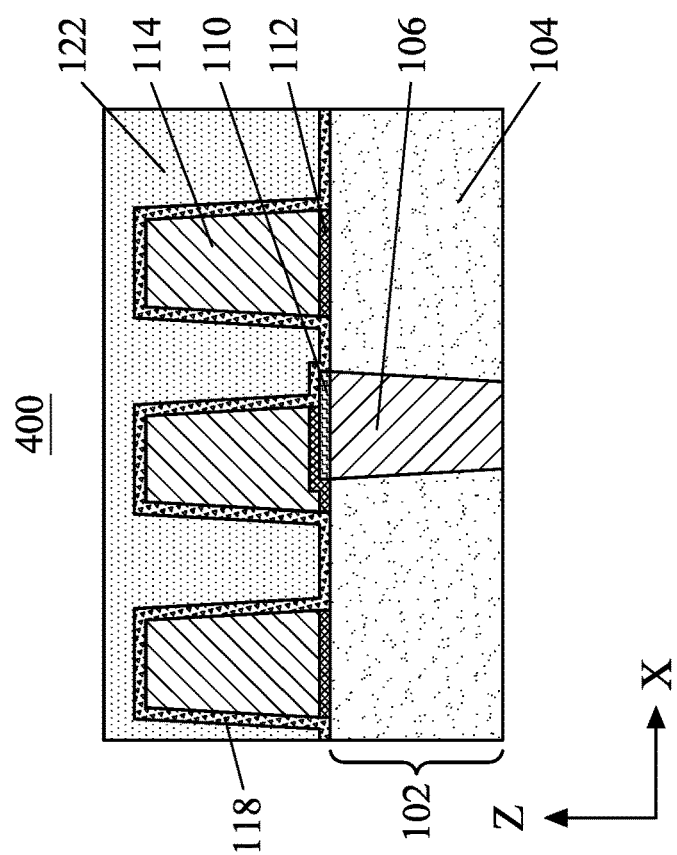

As shown in FIG. 4B, a planarization process may be performed to remove a portion of the dielectric fill 122, portions of the capping layer 118 and portions of the conductive layer 114. The planarization process may be any suitable process, such as a chemical-mechanical polishing (CMP) process. As a result of the planarization process, a top surface of the dielectric fill 122, the capping layer 118 and the conductive layer 114 may be substantially co-planar.

Figure 4D:
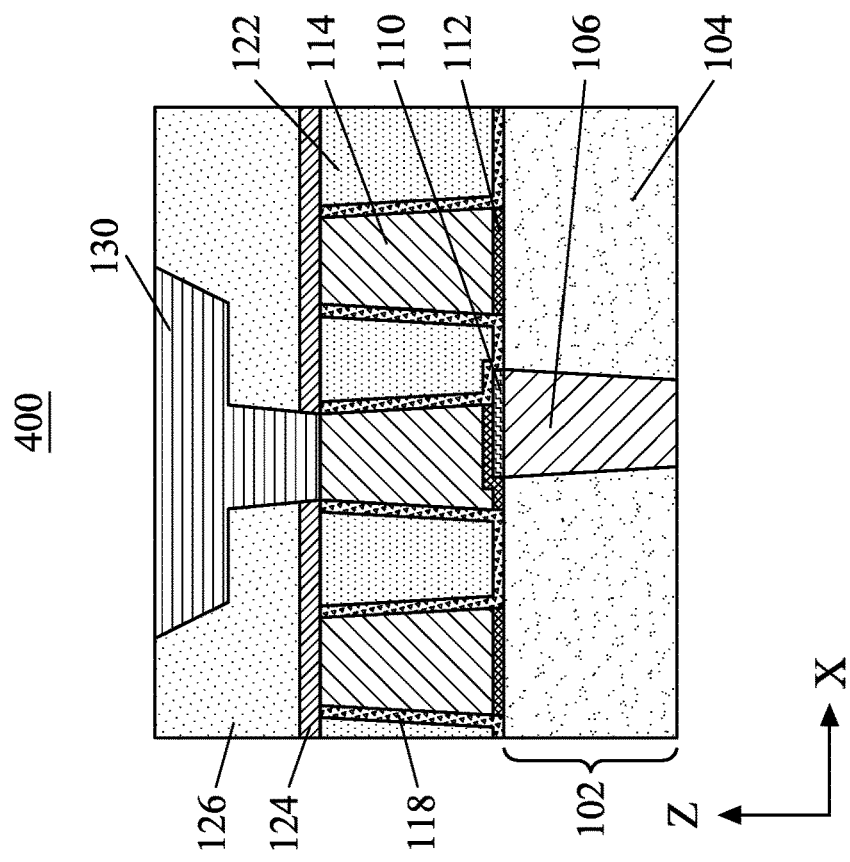
Figure 4C:
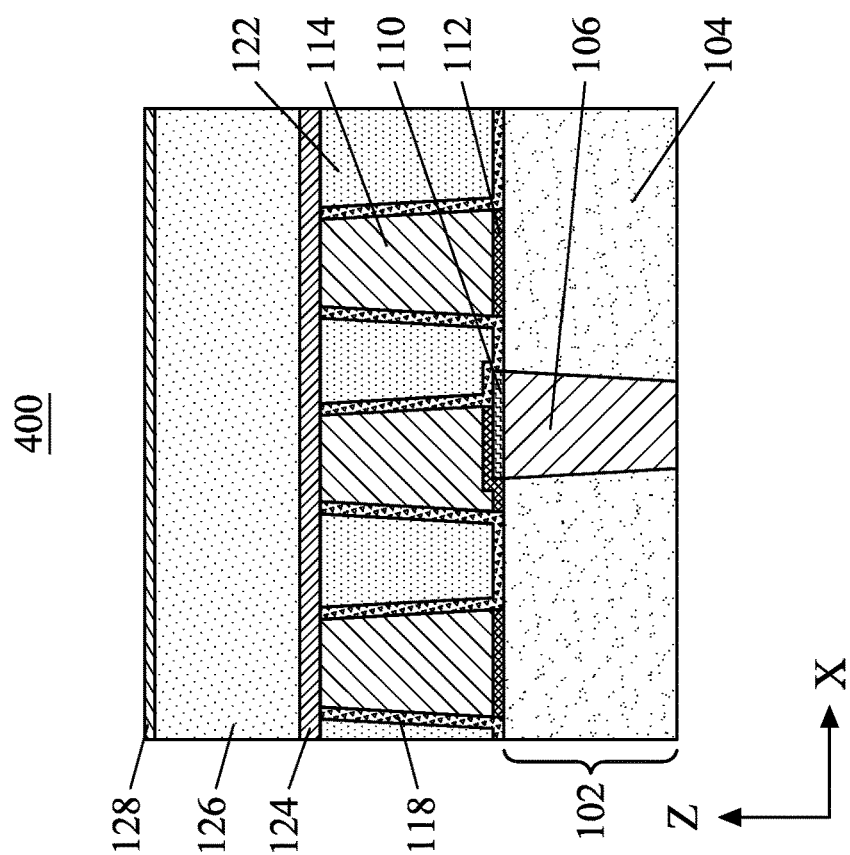

Then, as shown in FIG. 4C, an etch stop layer 124, a dielectric material 126 and a mask layer 128 may be formed on the dielectric fill 122, the capping layer 118 and the conductive layer 114. The etch stop layer 124 is formed on the planar surfaces of the dielectric fill 122, the capping layer 118 and the conductive layer 114. The etch stop layer 124 may be a single layer or a multi-layer structure. The etch stop layer 124 may include a metal oxide, such as Al, Zr, Y, Hf, or other suitable metal oxide, or a silicon-containing material, such as SiCO, SiCN, SiN, SiCON, $SiO_x$, SiC, SiON, or the like. The etch stop layer 124 may be formed by PVD, CVD, ALD, spin-on, or any suitable deposition process. The etch stop layer 124 may have a thickness ranging from about 1 Angstrom to about 100 Angstroms.

The dielectric material 126 is formed on the etch stop layer 124, and the mask layer 128 is formed on the dielectric material 126. The dielectric material 126 may include the same material as the dielectric fill 122 and may be formed by the same process as the dielectric fill 122. The etch stop layer 124 and the dielectric material 126 may have different etch selectivity. The mask layer 128 may include TiN, TaN, WN or other suitable metal nitride, and may be formed by PVD, CVD, ALD, or other suitable process.

As shown in FIG. 4D, a conductive feature 130 is formed in the dielectric material 126. In some embodiments, the conductive feature 130 may be formed by a plurality of operations. A contact opening may be first formed in the mask layer 128 and the dielectric material 126. The contact opening may be formed by any suitable etch/patterning process, such as a single-damascene or dual-damascene process. When forming the contact opening, because the etch stop layer 124 and the dielectric material 126 have different etch selectivity, the etch process may be stopped by the etch stop layer 124. Then, another etch process may be performed to remove a portion of the etch stop layer 124 and expose the via structure, the conductive layer 114.

Then, a conductive feature 130 is formed in the contact opening. In some embodiments, a barrier layer may be formed between the conductive feature 130 and the exposed dielectric material 126, the exposed etch stop layer 124 and the exposed conductive layer 114. The barrier layer may include Co, W, Ru, Al, Mo, Ti, TiN, TiSi, CoSi, NiSi, Cu, TaN, Ni, or TiSiNi and may be formed by any suitable process, such as PVD, ALD, or PECVD. In some embodiments, the barrier layer may be a conformal layer formed by a conformal process, such as ALD. The conductive feature 130 may include an electrically conductive material, such as a metal. For example, the conductive feature 130 includes Cu, Ni, Co, Ru, Ir, Al, Pt, Pd, Au, Ag, Os, W, Mo, alloys thereof, or other suitable material. The conductive feature 130 may be formed on the barrier layer by any suitable process, such as electro-chemical plating (ECP), PVD, CVD, or PECVD.

A planarization process may be performed to remove a portion of the barrier layer, the conductive feature 130, and the mask layer 128. The planarization process may be any suitable process, such as a CMP process. The top surfaces of the dielectric material 126 and the conductive feature 130 are substantially co-planar upon completion of the planarization process, as shown in FIG. 4D.

Figure 5:
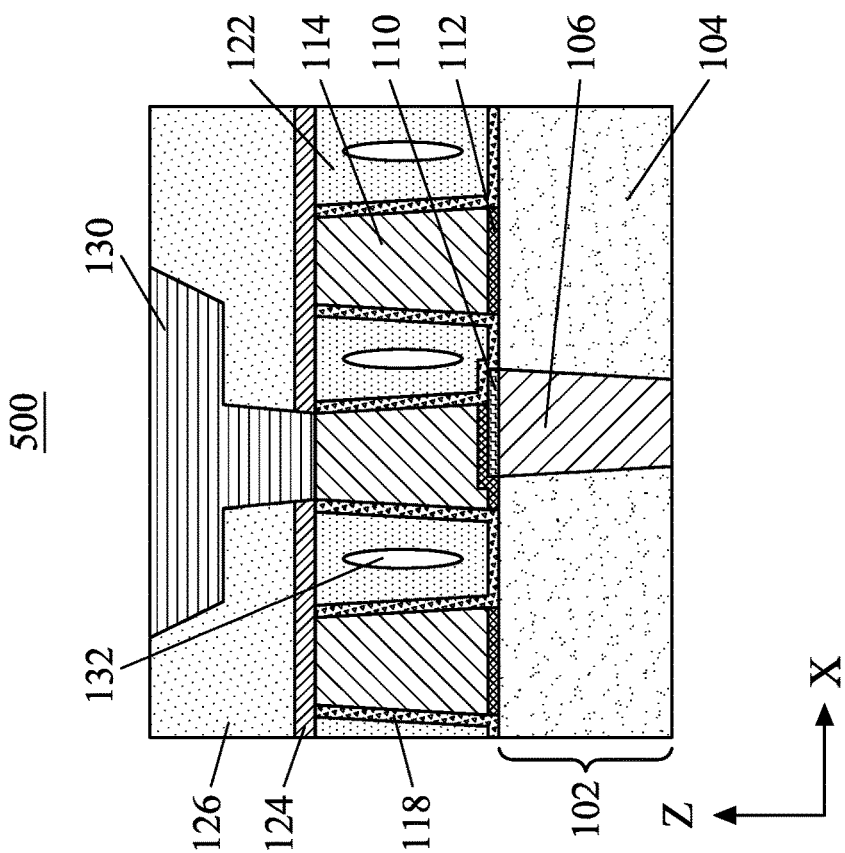
FIG. 5 is cross-sectional side views of another interconnect structure, in accordance with some embodiments.

FIG. 5 is cross-sectional side views of another interconnect structure 500, in accordance with some embodiments. The interconnect structure 500 is similar to the interconnect structure 400, and air gaps 132 are formed in the dielectric fill 122.

In some embodiments, to form the air gaps 132, a non-conformal CVD operation with a low step coverage condition may be utilized when forming the dielectric fill 122. By using non-conformal CVD, the upper portions of the dielectric fill 122 "pinch-off" (are connected) before the openings 116 (FIG. 2B) are fully filled with the dielectric material, thereby forming the air gaps 132 in the dielectric fill 122.

Figure 6:
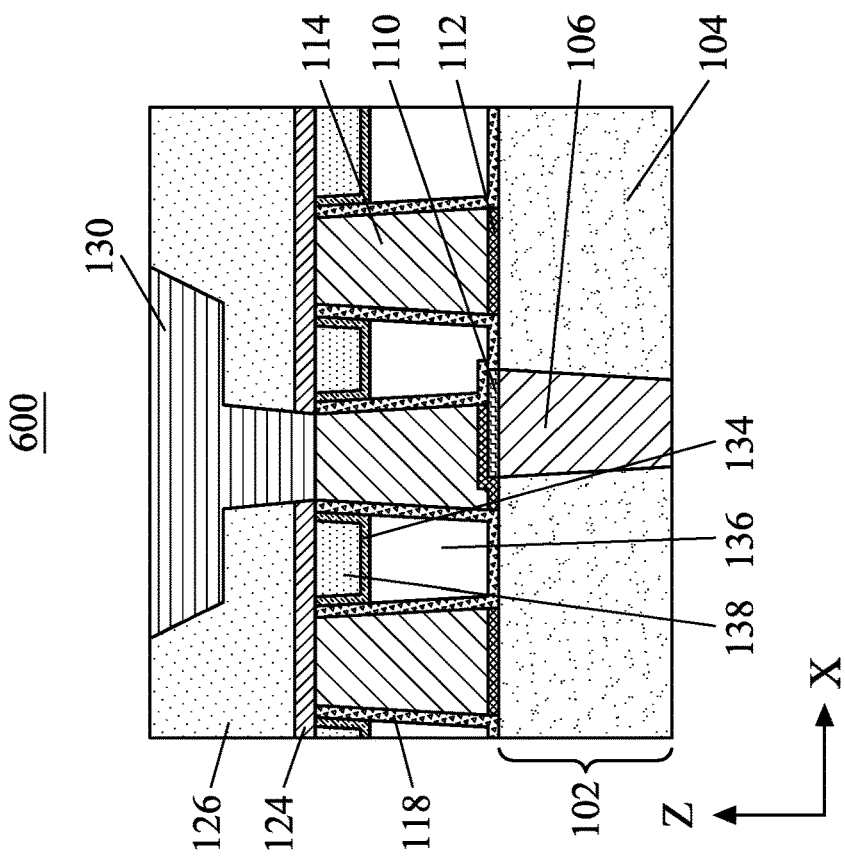
FIG. 6 is cross-sectional side views of a further interconnect structure, in accordance with some embodiments.

FIG. 6 is cross-sectional side views of a further interconnect structure 600, in accordance with some embodiments. The interconnect structure 600 is similar to the interconnect structures 400 and 500, and air gaps 136 are formed under the dielectric fill 138.

The air gaps 136 in FIG. 6 may be formed by a plurality of operations. In some embodiments, after the formation of the capping layer 118 (FIG. 2B), a sacrificial layer (not shown) is formed in the openings 116 and on the capping layer 118. The sacrificial layer may include a polymer, such as an organic layer having C, O, N, and/or H. In some embodiments, the sacrificial layer is a degradable gap-fill material such as polyurea. The sacrificial layer may be formed by any suitable process, such as CVD, ALD, molecular layer deposition (MLD), plasma enhanced CVD (PECVD), plasma enhanced ALD (PEALD), or spin-on.

Then, the sacrificial layer is recessed to a level below the level of a top surface of the conductive layer 114. The recess of the sacrificial layer 120 may be performed by any suitable process, such as thermal baking, UV curing, an etch-back process (e.g., a plasma etch process), or any combination thereof. In some embodiments, the sacrificial layer is recessed by a UV curing process that expose the sacrificial layer to UV energy having an energy density ranging from about 10 $mJ/cm^2$ to about 100 $J/cm^2$. The recess of the sacrificial layer may partially open the openings 116. In some embodiments, the recess of the sacrificial layer may expose at least a portion of the capping layer 118 in the openings 116.

Then, a support layer 134 is formed on the sacrificial layer and the capping layer 118. The support layer 134 may provide mechanical strength needed to sustain an air gap (e.g., air gap 136 in FIG. 6) subsequently formed between the support layer 134 and the capping layer 118. The support layer 134 may include Si, O, N, or any combinations thereof. In some embodiments, the support layer 134 includes $SiO_x$, SiCO, SiNO, SiCN, or SiCON. The support layer 134 may be porous in order to allow UV energy, thermal energy, or plasma, etc., to reach the sacrificial layer disposed therebelow. The support layer 134 may have a thickness ranging from about 2 Angstroms to about 100 Angstroms. The support layer 134 may be formed by any suitable process, such as PVD, CVD, ALD, PECVD, or PEALD. In some embodiments, the support layer 134 is a conformal layer formed by ALD or PEALD.

The sacrificial layer is then removed, forming the air gap 136 in each opening 116 between the support layer 134 and the capping layer 118. The removal of the sacrificial layer may be a result of degradation or decomposition of the sacrificial layer. The decomposition or degradation of the sacrificial layer may be performed by any suitable process, such as thermal baking and/or UV curing. In some embodiments, an UV curing process is performed to remove the sacrificial layer. The UV energy may pass through the porous support layer 134 to reach and remove the sacrificial layer. The UV energy may have an energy density ranging from about 10 mJ/cm² to about 100 J/cm². The removal of the sacrificial layer does not substantially affect the other layers of the interconnect structure 600. The air gap 136 may reduce capacitive coupling between neighboring portions of the conductive layer 114.

Then, the dielectric fill 138 is formed on the support layer 134. The dielectric fill 138 may enhance isolation of the air gaps 136 and provide adhesion between the support layer 134 and the subsequently formed etch stop layer 124. The material of the dielectric fill 138 may be the same with the dielectric fill 122 and may be formed by the same process.

Figure 7:
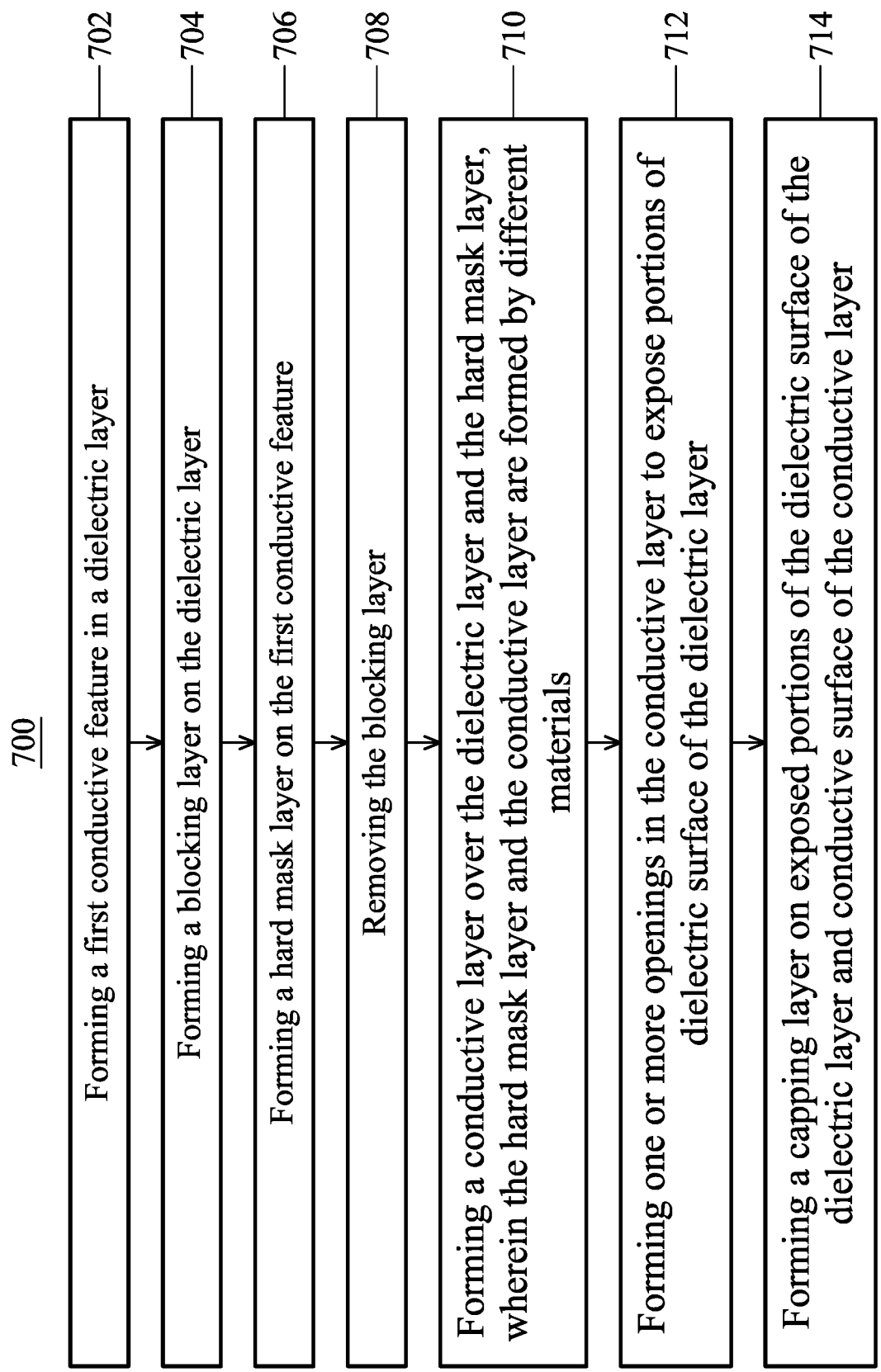
FIG. 7 is a flow chart of a method of manufacturing an interconnect structure in accordance with some embodiments.

FIG. 7 is a flow chart of a method 700 of manufacturing the interconnect structure 100, 200 or 300 in accordance with some embodiments. It is noted that the operations of the method 700, including any descriptions given with reference to the figures, are merely exemplary and are not intended to be limiting beyond what is specifically recited in the claims that follow. Additional operations may be implemented before, during, and after the method 700, and some operations may be replaced, eliminated, or rearranged in any desired order in accordance with various embodiments of the method 700.

The method 700 starts at operation 702 by forming a first conductive feature in a dielectric layer. The first conductive feature may be the conductive feature 106 and the dielectric layer may be the dielectric layer 104. The first conductive feature and the dielectric layer may be formed by the processes discussed above with respect to FIG. 1A.

At operation 704, a blocking layer is formed on the dielectric layer. The blocking layer may be the block layer 108. The blocking layer may be formed by the processes discussed above with respect to FIG. 1B. In some embodiments, the blocking layer may be formed by performing an oxide inhibition process. In some embodiments, by performing the oxide inhibition process, a silane based self-assembled monolayer (SAM) may be used as an inhibitor in the oxide inhibition process. In some embodiments, the blocking layer may include a polymer formed by silicon (Si), carbon (C), nitrogen (N) or oxygen (O).

At operation 706, a hard mask layer is formed on the first conductive feature. The hard mask layer may be the hard mask layer 110. The hard mask layer may be formed by the processes discussed above with respect to FIG. 1C. In some embodiments, the hard mask layer may be a tantalum nitride (TaN) layer.

At operation 708, the blocking layer is removed. The blocking layer may be removed by the processes discussed above with respect to FIG. 1D. The blocking layer may be removed by a dry etch process, a wet etch process or other suitable processes. After the removal of the blocking layer, the hard mask layer is remained on the conductive features.

At operation 710, a conductive layer is formed over the dielectric layer and the hard mask layer. The conductive layer may be the conductive layer 114, and the hard mask layer and the conductive layer are formed by different materials. In some embodiments, before forming the conductive layer, a glue layer may be further formed over the dielectric layer and the hard mask layer. The glue layer may be the glue layer 112. The conductive layer and the glue layer may be formed by the processes discussed above with respect to FIG. 1F.

At operation 712, one or more openings are formed in the conductive layer to expose portions of dielectric surface of the dielectric layer. The openings may be the openings 116. The openings may be formed by the processes discussed above with respect to FIG. 1G, 2A or 3A. In some embodiments, a first etch process is performed to remove a portion of the conductive layer to expose portions of dielectric surface of the dielectric layer.

At operation 714, a capping layer is formed on exposed portions of the dielectric surface of the dielectric layer and conductive surface of the conductive layer. The capping layer may be the capping layer 118. The capping layer may be formed by the processes discussed above with respect to FIG. 1H.

In some embodiments, a first etch process is performed to remove a portion of the conductive layer to expose portions of dielectric surface of the dielectric layer and a portion of the hard mask layer, and the hard mask layer and the conductive layer have different etch selectivity in the first etch process. Then, the capping layer is formed on exposed portions of the dielectric surface of the dielectric layer, conductive surface of the conductive layer, and the exposed portion of the hard mask layer.

In some embodiments, a first etch process is performed to remove a portion of the conductive layer to expose portions of dielectric surface of the dielectric layer and a portion of the hard mask layer, and a second etch process is performed to remove the exposed portion of the hard mask layer to expose a portion of the first conductive feature. Then, the capping layer is formed on exposed portions of the dielectric surface of the dielectric layer, conductive surface of the conductive layer, and the exposed portion of the first conductive feature.

In some embodiments, a sacrificial layer is formed in the one or more openings, the sacrificial layer is recessed, a support layer is formed on the recessed sacrificial layer in each of the one or more openings, the sacrificial layer is removed to form an air gap in each of the one or more openings, a dielectric fill is formed on the support layer, and a planarization process is performed to remove a portion of the dielectric fill and a portion of the capping layer to expose portions of the conductive layer.

In some embodiments, an etch stop layer is formed over the dielectric fill and the exposed portions of the conductive layer, a dielectric material is formed over the etch stop layer, and a second conductive feature is formed in the dielectric material over the conductive layer.

Figure 8:
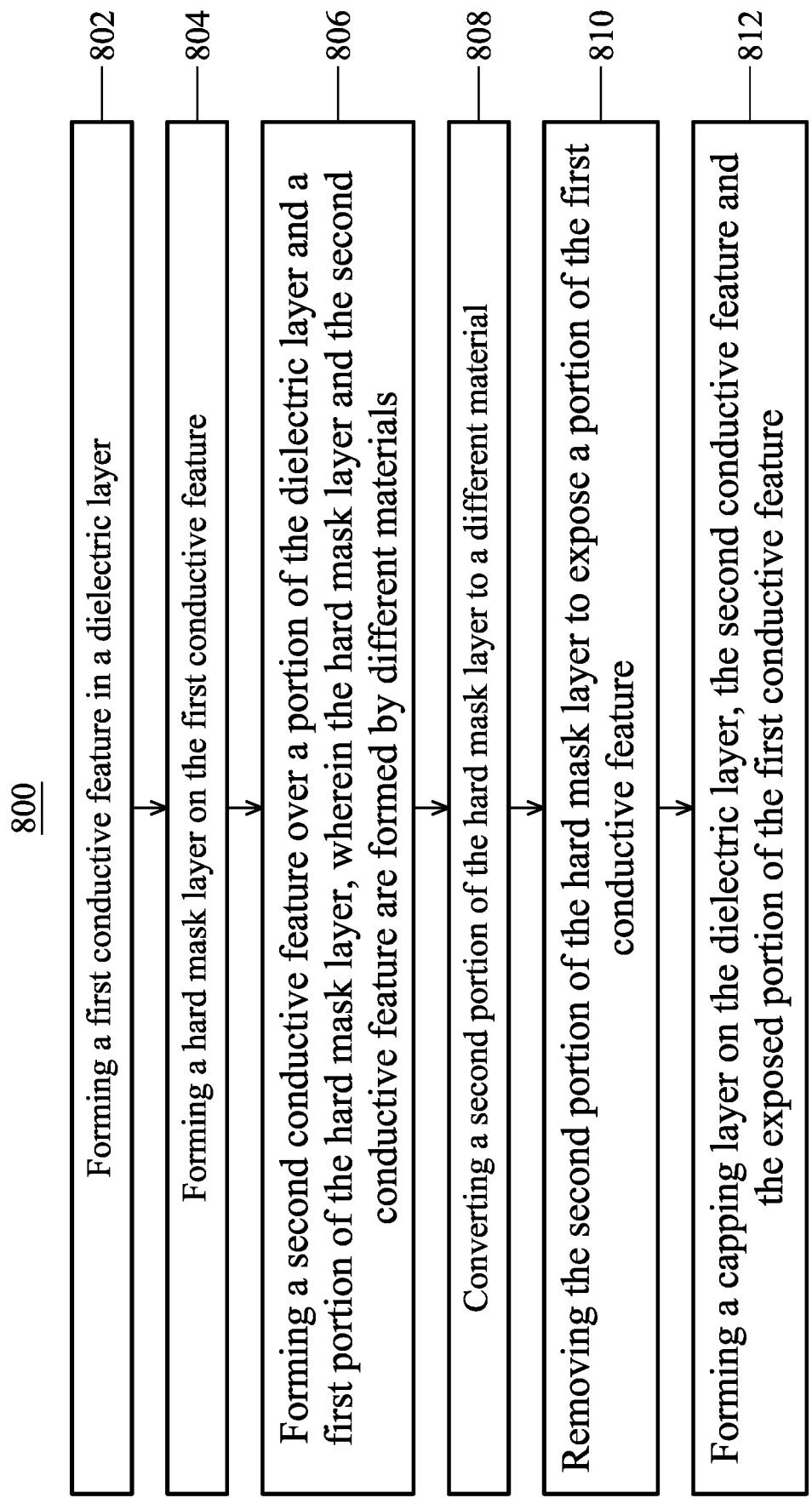
FIG. 8 is another flow chart of a method of manufacturing an interconnect structure in accordance with some embodiments.

FIG. 8 is another flow chart of a method 800 of manufacturing the interconnect structure 300 in accordance with some embodiments. The method 800 starts at operation 802 by forming a first conductive feature in a dielectric layer. The first conductive feature may be the conductive feature 106 and the dielectric layer may be the dielectric layer 104. The first conductive feature and the dielectric layer may be formed by the processes discussed above with respect to FIG. 1A.

At operation 804, a hard mask layer is formed on the first conductive feature. The hard mask layer may be the hard mask layer 110. The hard mask layer may be formed by the processes discussed above with respect to FIGS. 1B and 1C.

At operation 806, a second conductive feature is formed over a portion of the dielectric layer and a first portion of the hard mask layer. The first portion of the hard mask layer may be the hard mask layer 110 in FIG. 3A, and the second conductive feature may be the conductive layer 114 in FIG. 3A. The hard mask layer and the second conductive feature are formed by different materials.

At operation 808, a second portion of the hard mask layer is converted to a different material. The second portion of the hard mask layer may be the second portion of the hard mask layer 120. The second portion of the hard mask layer may be converted or treated by the processes discussed above with respect to FIG. 3A.

At operation 810, the second portion of the hard mask layer is removed to expose a portion of the first conductive feature. The second portion of the hard mask layer may be removed by the processes discussed above with respect to FIG. 3B. In some embodiments, the operation 810 may be optional.

At operation 812, a capping layer is formed on the dielectric layer, the second conductive feature and the exposed portion of the first conductive feature. The capping layer may be the capping layer 118. The capping layer may be formed by the processes discussed above with respect to FIG. 3C.

In some embodiments, a dielectric fill is formed over the capping layer, a planarization process is performed to remove a portion of the dielectric fill and a portion of the capping layer and expose a portion of the second conductive feature, an etch stop layer is formed over the dielectric fill and the exposed second conductive feature, a dielectric material is formed over the etch stop layer, and a third conductive feature is formed in the dielectric material in contact with the second conductive feature. In some embodiments, the dielectric fill may include an air gap.

Various embodiments of the present disclosure provide a hard mask layer 110 formed by materials different from the conductive feature 106, the glue layer 112 and the conductive layer 114. The hard mask layer 110 has a different selectivity to the etchants used in the etch process to remove the glue layer 112 and the conductive layer 114, so that when the misalignment of the via happens, the conductive feature 106 could be protected during the formation process of the openings 116.

During the removal of the glue layer 112 and the conductive layer 114, since the hard mask layer 110 covers the conductive feature 106 and the hard mask layer 110 has different selectivity to the etchants used in the etch process to remove the glue layer 112 and the conductive layer 114, the conductive feature 106 would not be damaged. During the removal of the exposed hard mask layer 110, since the hard mask layer 110 and the conductive feature 106 have different selectivity to the etchants used in the removal process of the exposed hard mask layer 110, the conductive feature 106 would not be damaged as well. Therefore, the conductive feature 106 could be protected by the hard mask layer 110 during the formation process of the openings 116.

An embodiment is an interconnect structure. The interconnect structure includes a dielectric layer, a first conductive feature, a hard mask layer, a conductive layer, and a capping layer. The first conductive feature is disposed in the dielectric layer. The hard mask layer is disposed on the first conductive feature. The conductive layer includes a first portion and a second portion, the first portion of the conductive layer is disposed over at least a first portion of the hard mask layer, and the second portion of the conductive layer is disposed over the dielectric layer. The hard mask layer and the conductive layer are formed by different materials. The capping layer is disposed on the dielectric layer and the conductive layer.

Another embodiment is a method for forming an interconnect structure. A first conductive feature is formed in a dielectric layer. A blocking layer is formed on the dielectric layer. A hard mask layer is formed on the first conductive feature. The blocking layer is removed. A conductive layer is formed over the dielectric layer and the hard mask layer, and the hard mask layer and the conductive layer are formed by different materials. One or more openings are formed in the conductive layer to expose portions of dielectric surface of the dielectric layer. A capping layer is formed on exposed portions of the dielectric surface of the dielectric layer and conductive surface of the conductive layer.

A further embodiment is a method for forming an interconnect structure. The method includes forming a first conductive feature in a dielectric layer, forming a hard mask layer on the first conductive feature, forming a second conductive feature over a portion of the dielectric layer and a first portion of the hard mask layer, the hard mask layer and the second conductive feature are formed by different materials, converting a second portion of the hard mask layer to a different material, removing the second portion of the hard mask layer to expose a portion of the first conductive feature, and forming a capping layer on the dielectric layer, the second conductive feature and the exposed portion of the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An interconnection structure, comprising:
    a dielectric layer;
    a first conductive feature disposed in the dielectric layer;
    a hard mask layer disposed on the first conductive feature;
    a conductive layer comprising a first portion and a second portion, wherein the first portion of the conductive layer is disposed over at least a first portion of the hard mask layer, and the second portion of the conductive layer is disposed over the dielectric layer, and wherein the hard mask layer and the conductive layer are formed by different materials;
    a capping layer disposed on the dielectric layer and the conductive layer;
    a dielectric fill disposed over the capping layer between the first portion and the second portion of the conductive layer;
    an etch stop layer disposed over the dielectric fill and the conductive layer;
    a dielectric material disposed over the etch stop layer; and
    a second conductive feature disposed in the dielectric material over the first portion of the conductive layer.

2. The interconnection structure of claim 1, wherein the capping layer is further disposed on a second portion of the hard mask layer different from the first portion of the hard mask layer.

3. The interconnection structure of claim 1, wherein the capping layer is further disposed on a portion of the first conductive feature.

4. The interconnection structure of claim 1, wherein an air gap is formed in the dielectric fill between the first portion and the second portion of the conductive layer.

5. A method for forming an interconnection structure, comprising:
    forming a first conductive feature in a dielectric layer;

forming a blocking layer on the dielectric layer;
forming a hard mask layer on the first conductive feature;
removing the blocking layer;
forming a conductive layer over the dielectric layer and the hard mask layer,
wherein the hard mask layer and the conductive layer are formed by different materials;
forming one or more openings in the conductive layer to expose portions of dielectric surface of the dielectric layer; and
forming a capping layer on exposed portions of the dielectric surface of the dielectric layer and conductive surface of the conductive layer.

6. The method of claim 5, wherein forming the blocking layer on the dielectric layer, comprises:
performing an oxide inhibition process to form the blocking layer on the dielectric layer.

7. The method of claim 6, wherein a silane based self-assembled monolayer (SAM) is used as an inhibitor in the oxide inhibition process.

8. The method of claim 6, wherein the blocking layer comprises a polymer formed by silicon (Si), carbon (C), nitrogen (N) or oxygen (O).

9. The method of claim 5, wherein the hard mask layer comprises a tantalum nitride (TaN) layer.

10. The method of claim 5, wherein forming one or more openings in the conductive layer to expose portions of dielectric surface of the dielectric layer, comprises:
performing a first etch process to remove a portion of the conductive layer to expose portions of dielectric surface of the dielectric layer.

11. The method of claim 5, wherein forming one or more openings in the conductive layer to expose portions of dielectric surface of the dielectric layer, comprises:
performing a first etch process to remove a portion of the conductive layer to expose portions of dielectric surface of the dielectric layer and a portion of the hard mask layer, wherein the hard mask layer and the conductive layer have different etch selectivity in the first etch process.

12. The method of claim 11, wherein forming the capping layer on exposed portions of the dielectric surface of the dielectric layer and conductive surface of the conductive layer, comprises:
forming the capping layer on exposed portions of the dielectric surface of the dielectric layer, conductive surface of the conductive layer, and the exposed portion of the hard mask layer.

13. The method of claim 5, wherein forming one or more openings in the conductive layer to expose portions of dielectric surface of the dielectric layer, comprises:
performing a first etch process to remove a portion of the conductive layer to expose portions of dielectric surface of the dielectric layer and a portion of the hard mask layer; and
performing a second etch process to remove the exposed portion of the hard mask layer to expose a portion of the first conductive feature.

14. The method of claim 13, wherein forming the capping layer on exposed portions of the dielectric surface of the dielectric layer and conductive surface of the conductive layer, comprises:
forming the capping layer on exposed portions of the dielectric surface of the dielectric layer, conductive surface of the conductive layer, and the exposed portion of the first conductive feature.

15. The method of claim 5 further comprising:
forming a sacrificial layer in the one or more openings;
recessing the sacrificial layer;
forming a support layer on the recessed sacrificial layer in each of the one or more openings;
removing the sacrificial layer to form an air gap in each of the one or more openings;
forming a dielectric fill on the support layer; and
performing a planarization process to remove a portion of the dielectric fill and a portion of the capping layer to expose portions of the conductive layer.

16. The method of claim 15 further comprising:
forming an etch stop layer over the dielectric fill and the exposed portions of the conductive layer;
forming a dielectric material over the etch stop layer; and
forming a second conductive feature in the dielectric material over the conductive layer.

17. A method for forming an interconnection structure, comprising:
forming a first conductive feature in a dielectric layer;
forming a hard mask layer on the first conductive feature;
forming a second conductive feature over a portion of the dielectric layer and a first portion of the hard mask layer, wherein the hard mask layer and the second conductive feature are formed by different materials;
converting a second portion of the hard mask layer to a different material;
removing the second portion of the hard mask layer to expose a portion of the first conductive feature; and
forming a capping layer on the dielectric layer, the second conductive feature and the exposed portion of the first conductive feature.

18. The method of claim 17 further comprising:
forming a dielectric fill over the capping layer;
performing a planarization process to remove a portion of the dielectric fill and a portion of the capping layer and expose a portion of the second conductive feature;
forming an etch stop layer over the dielectric fill and the exposed second conductive feature;
forming a dielectric material over the etch stop layer; and
forming a third conductive feature in the dielectric material in contact with the second conductive feature.

19. The method of claim 18, wherein the dielectric fill comprises an air gap.

20. The method of claim 17, wherein the hard mask layer comprises a metal nitride, and the second portion of the hard mask layer is converted to a metal oxide.

* * * * *